(12) United States Patent
Kong et al.

(10) Patent No.: US 10,193,718 B2
(45) Date of Patent: Jan. 29, 2019

(54) METHOD FOR DATA MODULATION IN WIRELESS COMMUNICATION SYSTEM AND APPARATUS FOR THE SAME

(71) Applicant: ELECTRONICS AND TELECOMMUNICATIONS RESEARCH INSTITUTE, Daejeon (KR)

(72) Inventors: Sun Woo Kong, Daejeon (KR); Bong Hyuk Park, Daejeon (KR); Moon Sik Lee, Daejeon (KR); Hui Dong Lee, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 9 days.

(21) Appl. No.: 15/870,826

(22) Filed: Jan. 12, 2018

(65) Prior Publication Data

US 2018/0205582 A1    Jul. 19, 2018

(30) Foreign Application Priority Data

Jan. 16, 2017  (KR) .................. 10-2017-0007168
Dec. 29, 2017  (KR) .................. 10-2017-0184017

(51) Int. Cl.
*H03F 3/45*     (2006.01)
*H03F 3/19*     (2006.01)
(Continued)

(52) U.S. Cl.
CPC ........... *H04L 25/4906* (2013.01); *H03F 3/19* (2013.01); *H03F 3/2171* (2013.01); *H03F 3/45179* (2013.01); *H03F 2203/45172* (2013.01)

(58) Field of Classification Search
CPC ... H04L 25/0272; H04L 25/02; H04L 67/303; H04L 7/027; H04L 12/40; H04L 12/40006; H04L 1/00; H04L 27/04; H04L 27/20
(Continued)

(56) References Cited

U.S. PATENT DOCUMENTS 9,178,735 B1    11/2015  Ho et al.
9,231,639 B2     1/2016  Park et al.
(Continued)

FOREIGN PATENT DOCUMENTS

KR    10-2012-0038275 A    4/2012
KR       101392323 B1      5/2014
KR    10-2015-0044538 A    4/2015

OTHER PUBLICATIONS

Sunwoo Kong et al., "60GHz CMOS On-Off-keying modulator", KICS 2017 Winter Conference. Jan. 18-20, 2017. English Abstract.

*Primary Examiner* — Sam K Ahn
*Assistant Examiner* — Sarah Hassan
(74) *Attorney, Agent, or Firm* — Rabin & Berdo, P.C.

(57) ABSTRACT

A data modulation apparatus may comprise a S2D conversion part including a first amplifier operating based on a carrier wave signal and two transformers receiving an output signal of the first amplifier; a first switch part transferring status of input data to the first amplifier based on the input data; a differential amplification part receiving output signals of the S2D conversion part and amplifying the output signals of the S2D conversion part; a D2S conversion part receiving output signals of the differential amplification part and performing modulation on the output signals by converting the output signals to a single signal; and a second switch part transferring the output signals of the differential amplification part to the D2S conversion part based on the
(Continued)

input data. Here, the first switch part and the second switch part may be alternately turned on and off.

16 Claims, 9 Drawing Sheets

(51) Int. Cl.
*H04L 25/49* (2006.01)
*H03F 3/217* (2006.01)

(58) Field of Classification Search
USPC .......................................... 375/219; 330/10
See application file for complete search history.

(56) References Cited

U.S. PATENT DOCUMENTS

| | | |
|---|---|---|
| 9,319,256 B2 | 4/2016 | Park et al. |
| 2013/0010848 A1* | 1/2013 | Shimizu ................... H04L 5/06 |
| | | 375/219 |
| 2013/0293295 A1* | 11/2013 | Noh ......................... H03F 3/602 |
| | | 330/124 R |
| 2014/0159809 A1* | 6/2014 | Chen ...................... H03F 3/2171 |
| | | 330/10 |
| 2015/0110224 A1 | 4/2015 | Kang et al. |
| 2016/0173035 A1* | 6/2016 | Doppke .................. H03F 3/193 |
| | | 330/252 |

\* cited by examiner

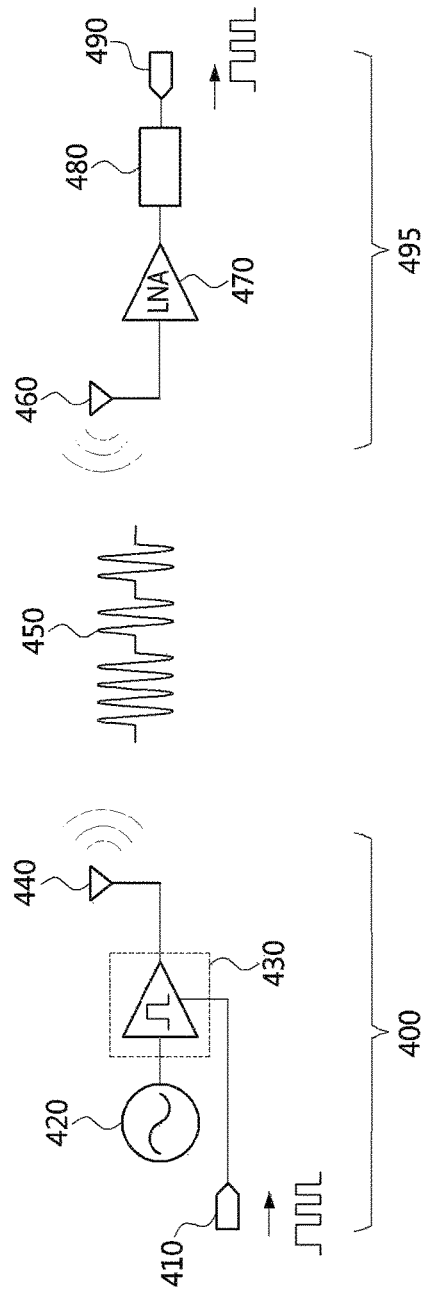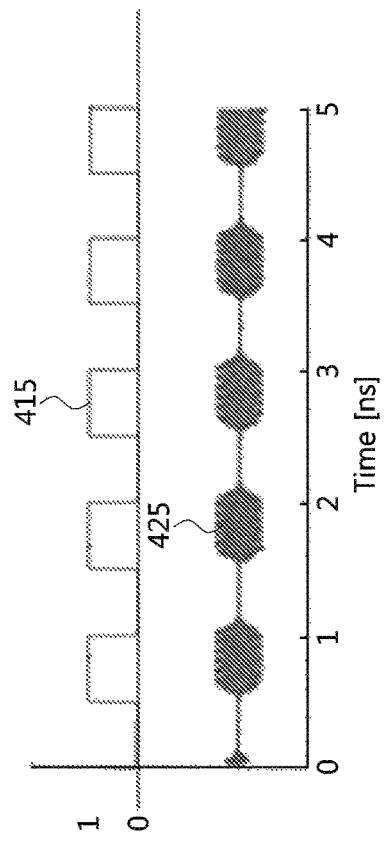

⎯⎯→ : CURRENT DIRECTION OF indA1 AND indA2
------→ : CURRENT DIRECTION OF indB1 AND indB2
⎯⎯→ : CURRENT DIRECTION OF indC1 AND indC2

Case 3

Case 4

METHOD FOR DATA MODULATION IN WIRELESS COMMUNICATION SYSTEM AND APPARATUS FOR THE SAME

CROSS-REFERENCE TO RELATED APPLICATIONS

This application claims priorities to Korean Patent Applications No. 10-2017-0007168 filed on Jan. 16, 2017 and No. 10-2017-0184017 filed on Dec. 29, 2017 in the Korean Intellectual Property Office (KIPO), the entire contents of which are hereby incorporated by reference.

BACKGROUND

1. Technical Field

The present disclosure relates to a data modulation method and a data modulation apparatus in a wireless communication system, and more specifically, to a method of on-off keying (OOK) modulation for high-speed communications and an apparatus using the same.

2. Related Art

It is expected that the fifth generation mobile communication, which aims at a data transmission rate of at least 10 to 100 times that of the fourth generation mobile communication, will be implemented in a frequency band of several tens of giga Hertz (GHz) frequency. For example, implementation in 30 GHz to 60 GHz frequency band is being discussed. Here, the wavelength at 30 GHz is 10 millimeters (mm). The fifth generation mobile communication technology is also referred to as a millimeter-wave mobile communication technology because the wavelengths in such the frequency bands are expressed in millimeters. In order to support high-speed data communications of Gbps level required in the fifth generation mobile communication by a mobile terminal, a low power mobile communication system considering restrictions due to limited power of the terminal is required. Also, despite a low power structure of the mobile communication system, a high signal processing gain and high stability are required even though it processes high frequency signals in the millimeter-wave bands.

SUMMARY

Accordingly, embodiments of the present disclosure provide a data modulation method which is stable in wireless communication systems supporting up to several Gbps data transmission rates and has characteristics of high gain and low power consumption, and a data modulation apparatus using the same.

In order to achieve the objective of the present disclosure, a data modulation apparatus may comprise a single-to-differential (S2D) conversion part including a first amplifier operating based on a carrier wave signal and two transformers receiving an output signal of the first amplifier; a first switch part transferring status of input data to the first amplifier based on the input data; a differential amplification part receiving output signals of the S2D conversion part and amplifying the output signals of the S2D conversion part; a differential-to-signal (D2S) conversion part receiving output signals of the differential amplification part and performing modulation on the output signals of the differential amplification part by converting the output signals of the differential amplification par to a single signal; and a second switch part transferring the output signals of the differential amplification part to the D2S conversion part based on the input data. Here, the first switch part and the second switch part may be alternately turned on and off.

The data modulation apparatus may further comprise an input matching part receiving the carrier wave signal and outputting the carrier wave signal to the first amplifier.

The differential amplification part may include a second amplifier and a third amplifier each of which receives differential output signals from the S2D conversion part.

The two transformers may include a first transformer connected to a first inductor of the first amplifier and a second transformer connected to a second inductor of the first amplifier, and the first inductor and the second inductor may be connected in parallel with the first amplifier.

The first transformer may include a first inductor connected in series to the first inductor of the first amplifier and a second inductor connected to the first inductor of the first amplifier in a non-contact manner, and the second transformer may include a first inductor connected in series to the second inductor of the first amplifier and a second inductor connected to the second inductor of the first amplifier in a non-contact manner.

A phase difference between a mutual inductive voltage between the first inductor of the first amplifier and the first inductor of the first transformer and a mutual inductance voltage between the first inductor of the first amplifier and the second inductor of the first transformer is 180 degrees, and a phase difference between a mutual inductive voltage between the second inductor of the first amplifier and the first inductor of the second transformer and a mutual inductance voltage between the second inductor of the first amplifier and the second inductor of the second transformer is 180 degrees.

The data modulation apparatus may further comprise a first capacitor connected in parallel between the first inductor of the first amplifier and the first inductor of the first transformer, and a second capacitor connected in parallel between the second inductor of the first amplifier and the first inductor of the second transformer.

Input ends of the second amplifier may be connected to output ends of the first transformer, and input ends of the third amplifier may be connected to output ends of the second transformer.

The D2S conversion part may perform D2S conversion and output matching through coupling between an inductor connected to output ends of the differential amplification part and an inductor connected to a modulated signal output part.

In order to achieve the objective of the present disclosure, a data modulation method in a wireless communication system may comprise receiving a carrier wave signal by a first amplifier of a single-to-differential (S2D) conversion part; receiving input data by input ends of a first switch part and a second switch part; converting an output signal of the first amplifier into differential signals by using two transformers connected in parallel with output ends of the first amplifier; differentially amplifying the differential signals by a differential amplification part including a second amplifier and a third amplifier; and transferring output signals of the differential amplification part to a differential-to-single (D2S) conversion part based on an operation of the second switch part.

The first switch part and the second switch part may be alternately turned on and off.

The carrier wave signal input to the first amplifier of the S2D conversion part may be input-matched.

The two transformers may include a first transformer connected to a first inductor of the first amplifier and a second transformer connected to a second inductor of the first amplifier, and the first inductor and the second inductor may be connected in parallel with the first amplifier.

The first transformer may include a first inductor connected in series to the first inductor of the first amplifier and a second inductor connected to the first inductor of the first amplifier in a non-contact manner, and the second transformer may include a first inductor connected in series to the second inductor of the first amplifier and a second inductor connected to the second inductor of the first amplifier in a non-contact manner.

A phase difference between a mutual inductive voltage between the first inductor of the first amplifier and the first inductor of the first transformer and a mutual inductance voltage between the first inductor of the first amplifier and the second inductor of the first transformer is 180 degrees, and a phase difference between a mutual inductive voltage between the second inductor of the first amplifier and the first inductor of the second transformer and a mutual inductance voltage between the second inductor of the first amplifier and the second inductor of the second transformer is 180 degrees.

The S2D conversion part may further comprise a first capacitor connected in parallel between the first inductor of the first amplifier and the first inductor of the first transformer, and a second capacitor connected in parallel between the second inductor of the first amplifier and the first inductor of the second transformer.

Input ends of the second amplifier may be connected to output ends of the first transformer, and input ends of the third amplifier may be connected to output ends of the second transformer.

The D2D conversion part may perform D2S conversion and output matching through coupling between an inductor connected to output ends of the differential amplification part and an inductor connected to a modulated signal output part.

According to the above-described embodiments of the present disclosure, it is made possible to improve performance of switching operations in the OOK modulation apparatus that operates at a low power and determines a data transmission rate at the same time while maintaining a high frequency amplification gain. Also, high-frequency oscillation, which is likely to occur when amplifying high-frequency signals such as millimeter-wave band signals, and instability of the system due to the high-frequency oscillation can be eliminated, thereby enabling high-stability signal amplification in the high frequency OOK modulation apparatus.

BRIEF DESCRIPTION OF DRAWINGS

Embodiments of the present disclosure will become more apparent by describing in detail embodiments of the present disclosure with reference to the accompanying drawings, in which:

FIG. 4A is a conceptual diagram illustrating a communication system to which an OOK modulation in a millimeter-wave band is applied;

FIG. 4B is a conceptual diagram for explaining an OOK modulation in a millimeter-wave band;

DETAILED DESCRIPTION

Figure 1:
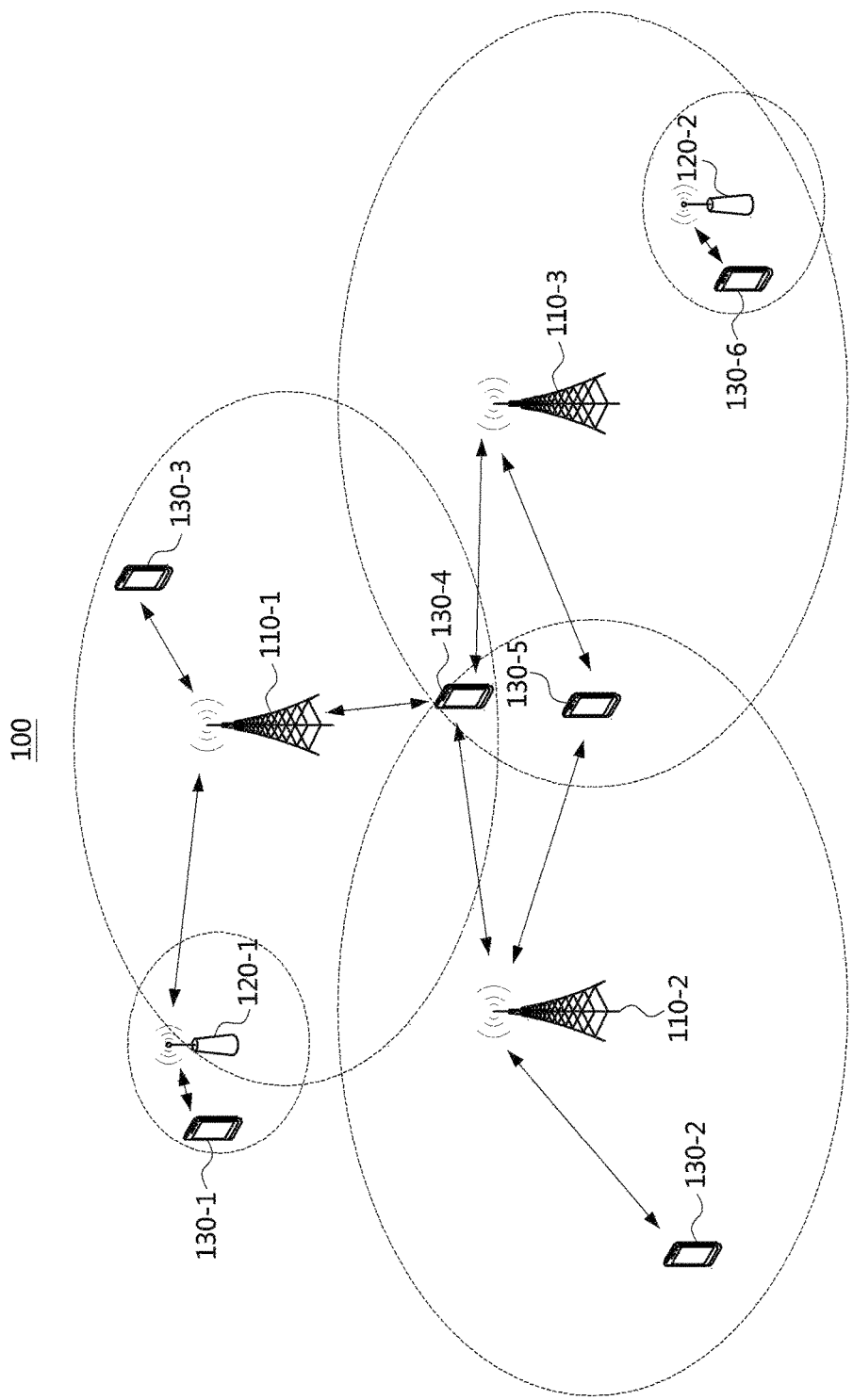
FIG. 1 is a conceptual diagram illustrating a first embodiment of a cellular communication system.

Embodiments of the present disclosure are disclosed herein. However, specific structural and functional details disclosed herein are merely representative for purposes of describing embodiments of the present disclosure, however, embodiments of the present disclosure may be embodied in many alternate forms and should not be construed as limited to embodiments of the present disclosure set forth herein.

Accordingly, while the present disclosure is susceptible to various modifications and alternative forms, specific embodiments thereof are shown by way of example in the drawings and will herein be described in detail. It should be understood, however, that there is no intent to limit the present disclosure to the particular forms disclosed, but on the contrary, the present disclosure is to cover all modifications, equivalents, and alternatives falling within the spirit and scope of the present disclosure. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between," "adjacent" versus "directly adjacent," etc.).

The terminology used herein is for the purpose of describing particular embodiments only and is not intended to be limiting of the present disclosure. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this present disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the present disclosure will be described in greater detail with reference to the accompanying drawings. In order to facilitate general understanding in describing the present disclosure, the same components in the drawings are denoted with the same reference signs, and repeated description thereof will be omitted.

Hereinafter, wireless communication networks to which exemplary embodiments according to the present disclosure will be described. However, wireless communication networks to which exemplary embodiments according to the present disclosure are applied are not restricted to what will be described below. That is, exemplary embodiments according to the present disclosure may be applied to various wireless communication networks.

FIG. 1 is a conceptual diagram illustrating a first embodiment of a cellular communication system.

Referring to FIG. 1, a communication system 100 may comprise a plurality of communication nodes 110-1, 110-2, 110-3, 120-1, 120-2, 130-1, 130-2, 130-3, 130-4, 130-5, and 130-6. Also, the communication system 100 may comprise a core network (e.g., a serving gateway (S-GW), a packet data network (PDN) gateway (P-GW), a mobility management entity (MME), and the like).

The plurality of communication nodes may support $4^{th}$ generation (4G) communication (e.g., long term evolution (LTE), LTE-advanced (LTE-A)), or $5^{th}$ generation (5G) communication defined in the $3^{rd}$ generation partnership project (3GPP) standard. The 4G communication may be performed in a frequency band below 6 gigahertz (GHz), and the 5G communication may be performed in a frequency band above 6 GHz. For example, for the 4G and 5G communications, the plurality of communication nodes may support at least one communication protocol among a code division multiple access (CDMA) based communication protocol, a wideband CDMA (WCDMA) based communication protocol, a time division multiple access (TDMA) based communication protocol, a frequency division multiple access (FDMA) based communication protocol, an orthogonal frequency division multiplexing (OFDM) based communication protocol, an orthogonal frequency division multiple access (OFDMA) based communication protocol, a single carrier FDMA (SC-FDMA) based communication protocol, a non-orthogonal multiple access (NOMA) based communication protocol, and a space division multiple access (SDMA) based communication protocol. Also, each of the plurality of communication nodes may have the following structure.

Figure 2:
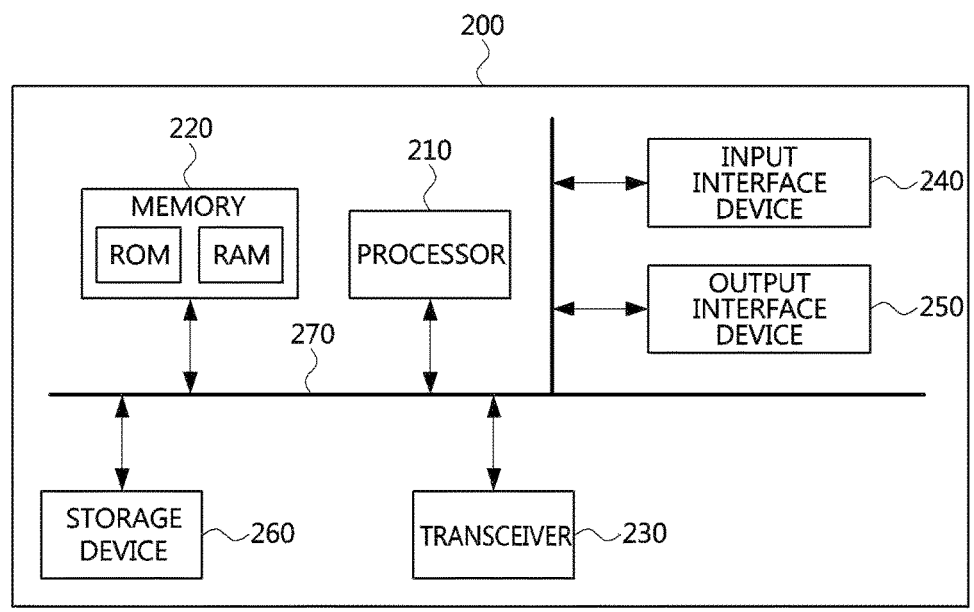
FIG. 2 is a block diagram illustrating a first embodiment of a communication node constituting a cellular communication system.

FIG. 2 is a block diagram illustrating a first embodiment of a communication node constituting a cellular communication system.

Referring to FIG. 2, a communication node 200 may comprise at least one processor 210, a memory 220, and a transceiver 230 connected to the network for performing communications. Also, the communication node 200 may further comprise an input interface device 240, an output interface device 250, a storage device 260, and the like. Each component included in the communication node 200 may communicate with each other as connected through a bus 270.

The processor 210 may execute a program stored in at least one of the memory 220 and the storage device 260. The processor 210 may refer to a central processing unit (CPU), a graphics processing unit (GPU), or a dedicated processor on which methods in accordance with embodiments of the present disclosure are performed. Each of the memory 220 and the storage device 260 may be constituted by at least one of a volatile storage medium and a non-volatile storage medium. For example, the memory 220 may comprise at least one of read-only memory (ROM) and random access memory (RAM).

Referring again to FIG. 1, the communication system 100 may comprise a plurality of base stations 110-1, 110-2, 110-3, 120-1, and 120-2, and a plurality of terminals 130-1, 130-2, 130-3, 130-4, 130-5, and 130-6. Each of the first base station 110-1, the second base station 110-2, and the third base station 110-3 may form a macro cell, and each of the fourth base station 120-1 and the fifth base station 120-2 may form a small cell. The fourth base station 120-1, the third terminal 130-3, and the fourth terminal 130-4 may belong to cell coverage of the first base station 110-1. Also, the second terminal 130-2, the fourth terminal 130-4, and the fifth terminal 130-5 may belong to cell coverage of the second base station 110-2. Also, the fifth base station 120-2, the fourth terminal 130-4, the fifth terminal 130-5, and the sixth terminal 130-6 may belong to cell coverage of the third base station 110-3. Also, the first terminal 130-1 may belong to cell coverage of the fourth base station 120-1, and the sixth terminal 130-6 may belong to cell coverage of the fifth base station 120-2.

Here, each of the plurality of base stations 110-1, 110-2, 110-3, 120-1, and 120-2 may refer to a Node-B, a evolved Node-B (eNB), a base transceiver station (BTS), a radio base station, a radio transceiver, an access point, an access node, or the like. Also, each of the plurality of terminals 130-1, 130-2, 130-3, 130-4, 130-5, and 130-6 may refer to a user equipment (UE), a terminal, an access terminal, a mobile terminal, a station, a subscriber station, a mobile station, a portable subscriber station, a node, a device, or the like.

Meanwhile, each of the plurality of base stations 110-1, 110-2, 110-3, 120-1, and 120-2 may operate in the same frequency band or in different frequency bands. The plurality of base stations 110-1, 110-2, 110-3, 120-1, and 120-2 may be connected to each other via an ideal backhaul or a non-ideal backhaul, and exchange information with each other via the ideal or non-ideal backhaul. Also, each of the plurality of base stations 110-1, 110-2, 110-3, 120-1, and 120-2 may be connected to the core network through the ideal or non-ideal backhaul. Each of the plurality of base stations 110-1, 110-2, 110-3, 120-1, and 120-2 may transmit a signal received from the core network to the corresponding terminal 130-1, 130-2, 130-3, 130-4, 130-5, or 130-6, and transmit a signal received from the corresponding terminal 130-1, 130-2, 130-3, 130-4, 130-5, or 130-6 to the core network.

Each of the plurality of base stations 110-1, 110-2, 110-3, 120-1, and 120-2 may support downlink transmission based on orthogonal frequency division multiple access (OFDMA), and uplink transmission based on single-carrier frequency division multiple access (SC-FDMA). Also, each of the plurality of base stations 110-1, 110-2, 110-3, 120-1, and 120-2 may support a multi-input multi-output (MIMO) transmission (e.g., a single-user MIMO (SU-MIMO), a multi-user MIMO (MU-MIMO), a massive MIMO, or the like), a coordinated multipoint (CoMP) transmission, a carrier aggregation (CA) transmission, a transmission in unlicensed band, a device-to-device (D2D) communications (or, proximity services (ProSe)), or the like. Here, each of the plurality of terminals 130-1, 130-2, 130-3, 130-4, 130-5, and 130-6 may perform operations corresponding to the operations of the plurality of base stations 110-1, 110-2, 110-3, 120-1, and 120-2 (i.e., the operations supported by the plurality of base stations 110-1, 110-2, 110-3, 120-1, and 120-2).

For example, the second base station 110-2 may transmit a signal to the fourth terminal 130-4 in the SU-MIMO manner, and the fourth terminal 130-4 may receive the signal from the second base station 110-2 in the SU-MIMO manner. Alternatively, the second base station 110-2 may transmit a signal to the fourth terminal 130-4 and fifth terminal 130-5 in the MU-MIMO manner, and the fourth terminal 130-4 and fifth terminal 130-5 may receive the signal from the second base station 110-2 in the MU-MIMO manner. The first base station 110-1, the second base station 110-2, and the third base station 110-3 may transmit a signal to the fourth terminal 130-4 in the CoMP transmission manner, and the fourth terminal 130-4 may receive the signal from the first base station 110-1, the second base station 110-2, and the third base station 110-3 in the CoMP manner. Also, each of the plurality of base stations 110-1, 110-2, 110-3, 120-1, and 120-2 may exchange signals with the corresponding terminals 130-1, 130-2, 130-3, 130-4, 130-5, or 130-6 which belongs to its cell coverage in the CA manner. Each of the base stations 110-1, 110-2, and 110-3 may control D2D communications between the fourth terminal 130-4 and the fifth terminal 130-5, and thus the fourth terminal 130-4 and the fifth terminal 130-5 may perform the D2D communications under control of the second base station 110-2 and the third base station 110-3.

Hereinafter, data modulation techniques of a wireless communication system will be described. Here, even when a method (e.g., transmission or reception of a signal) to be performed in a first communication node among communication nodes is described, the corresponding second communication node may perform a method (e.g., reception or transmission of the signal) corresponding to the method performed in the first communication node. That is, when an operation of a terminal is described, the corresponding base station may perform an operation corresponding to the operation of the terminal. Conversely, when an operation of a base station is described, the corresponding terminal may perform an operation corresponding to the operation of the base station.

There is a demand for utilization of millimeter-wave bands to support high-speed data communications of several Gbps required in the fifth generation mobile communication, and to cope with depletion of radio frequency (RF) resources used in wireless communication systems. The use of the millimeter-wave bands allows the use of the corresponding frequency band without interference with other existing wireless communication systems, and a Gbps-class wireless communication system can be easily implemented even by a communication technique having low frequency efficiency. In particular, since micro processing of complementary metal oxide semiconductor (CMOS), which is a standard semiconductor process technology, can be performed even at 100 nm or less, an RF circuit of a transceiver in a millimeter-wave band of 30 to 60 GHz can be easily implemented, so that the utilization of the wireless communication system using the millimeter-wave bands is becoming easier.

Meanwhile, in a wireless communication system, a modulation technique for data is applied to increase the frequency efficiency. There are various modulation schemes used in wireless communication systems such as Quadrature Phase Shift Keying (QPSK) or 64 Quadrature Amplitude Modulation (64QAM). The higher the order of the modulation scheme, the higher the frequency efficiency. However, there is a problem that the power consumption increases and the peak-to-average power ratio (PAPR) on the power amplifier increases. However, in a wireless communication system using a millimeter-wave band, since a broadband can be used over a conventional GHz frequency band, a simple modulation scheme such as On-off Keying (OOK) modulation is used instead of the conventional complex modulation schemes to implement high-speed data communications. When the OOK modulation scheme is used, it is possible to perform modulation simply by turning on or off a mixer or a power amplifier of a transmitter, thereby minimizing the PAPR of the power amplifier and enhancing output power efficiency of the power amplifier. Accordingly, the OOK modulation is suitable for a system that transmits data at low power. Hereinafter, an OOK modulation method will be described in further detail.

Figure 3:
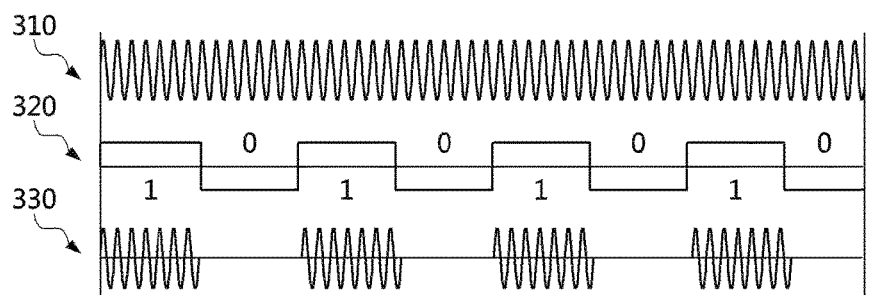
FIG. 3 is a conceptual diagram for explaining OOK modulation.

FIG. 3 is a conceptual diagram for explaining OOK modulation.

Referring to FIG. 3, an OOK modulation scheme is applied to input data 320. The Input data 320 may be a bit stream, and input to a modulation apparatus. For example, the input data [1,0,1,0,1,0,1,0] may be input as arbitrary input data to the modulation apparatus. It may be possible to input the input data to the modulation apparatus in units of a specific number or one by one. A final modulated signal 330 may then be generated by carrying the input data 320 on a carrier wave 310. Referring to the modulated signal 330, a signal may be carried on the carrier only when each corresponding bit of the input data is '1', and a signal may not be carried on the carrier when each corresponding bit of the input data is '0'. As described above, a signal may be transmitted through an antenna through a radio channel only when each corresponding bit of the input data is '1'. Conversely, a signal may also be configured to be transmitted through an antenna through a radio channel only when each corresponding bit of the input data is '0'. This may be determined according to the specific implementation of the wireless communication system.

Usually, a power amplifier used in a communication system consumes the largest power in the communication system regardless of input data. However, in the case of the OOK modulation, as described above, the power may be consumed only when each bit of the input data is '1' (or, '0'), and the current is cut off when each bit of the input data is '0' (or, '1'). According to this feature, it is possible to implement a transmission apparatus with low power consumption by using the OOK modulation. The frequency of the carrier wave 310 may be changed according to the communication system to be implemented. In the case of millimeter-wave OOK, the frequency of the carrier wave 310 may be several tens of GHz as described above. Hereinafter, a communication system to which the millimeter-wave OOK modulation is applied will be described.

FIG. 4A is a conceptual diagram illustrating a communication system to which an OOK modulation in a millimeter-wave band is applied, and FIG. 4B is a conceptual diagram for explaining an OOK modulation in a millimeter-wave band.

Referring to FIG. 4A, input data input to an input unit 410 of a transmission apparatus 400 may be modulated by an OOK modulating unit 430 in the transmission apparatus 400 and then transmitted through a radio channel. Then, a reception apparatus 495 may receive and demodulate the modulated input data, generate output data, and output the output data via an output unit 490.

The transmission apparatus 400 may comprise the input unit 410, a carrier wave generating unit 420, an OOK modulating unit 430, and a transmission antenna unit 440. The reception apparatus 495 may comprise a reception antenna unit 460, a low noise amplifier (LNA) 470, a detecting unit 480, and the output unit 490.

When the input data of several Gbps is input to the OOK modulating unit 430 through the input unit 410, the OOK modulating unit 430 may modulate the carrier wave of the millimeter-wave band generated by the carrier wave generating unit 420 based on the input data. Referring to FIG. 4B, input data 415 of 2 Gbps is shown as an example of the input data, and a modulated signal 425 modulated on a 60 GHz carrier is shown as an example of the modulated signal. Unlike the embodiment of FIG. 4B, a transmission rate of the input data and the frequency band of the carrier wave may be changed according to implementations.

The modulated carrier wave may be transmitted as the modulated signal through a radio channel by the transmission antenna unit 440. The modulated signal that has passed through the radio channel may be received by the reception apparatus 495 through the reception antenna unit 460 of the reception apparatus 495. The received modulated signal may be low-noise-amplified by the LNA 470.

The LNA 470 may amplify the weak modulated signal received at the reception antenna unit 460 of the reception apparatus 495. The LNA is characterized by a small noise figure, so that a noise generated during amplification is small, and a very small level of the received signal can be amplified without being buried in the noise. The modulated signal amplified at the LNA 470 may be demodulated to the original input data through the detecting unit 480 and the demodulator (not shown).

However, when the data of the millimeter-wave band is transmitted based on the conventional OOK modulation as in the embodiment shown in FIGS. 4A and 4B, power efficiency of modulation may not be high. Also, since the modulated signal contains information in its amplitude, the modulated signal has a disadvantage that it is vulnerable to noise, and there are disadvantages such as a low signal gain of a circuit and a signal leakage phenomenon due to frequency characteristics. Also, a CMOS-based OOK modulation type transceiver which has been recently developed for the millimeter-wave band has problems such as very low power gain and stability degradation due to high frequency signal amplification. Hereinafter, an embodiment of the present disclosure for solving the problems of data transmission in the millimeter-wave band using such a conventional OOK modulation will be described.

Figure 5:
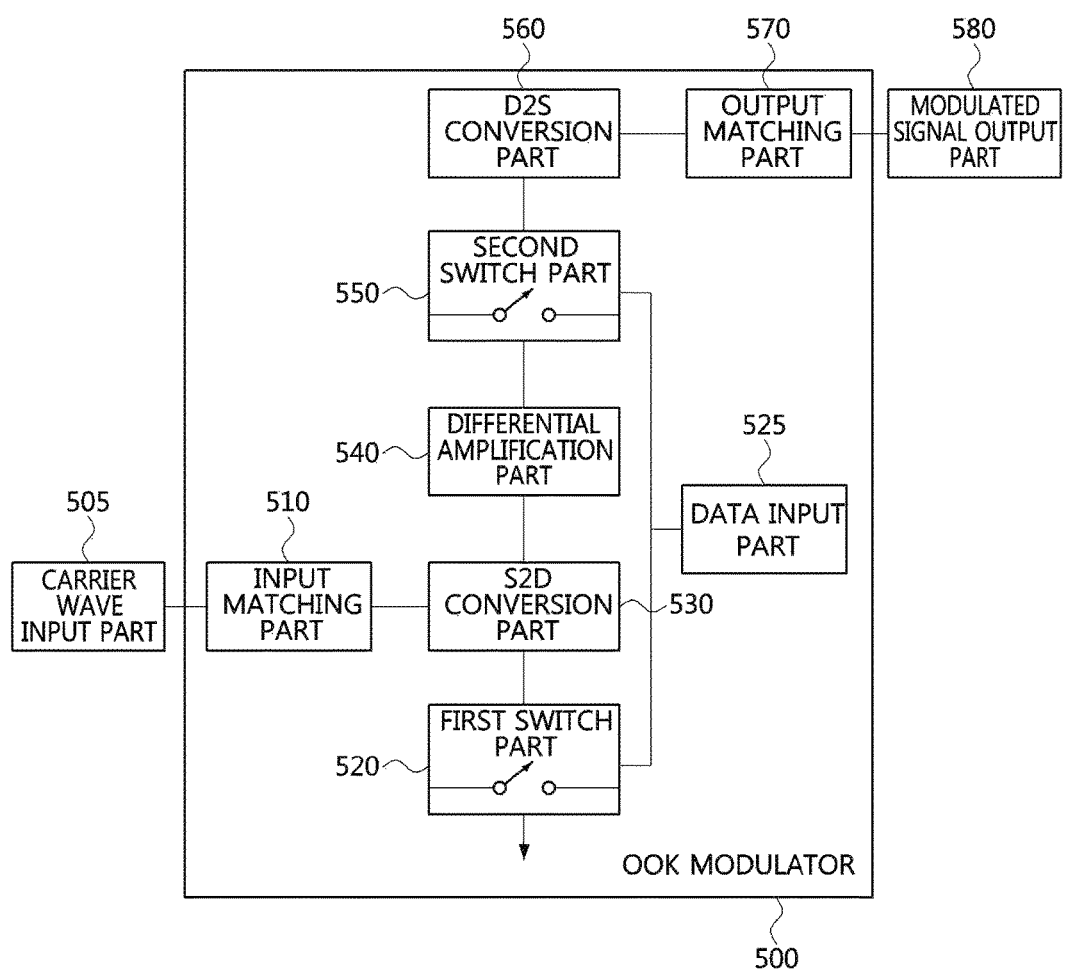
FIG. 5 is a block diagram illustrating a differential amplification-based OOK modulator according to an embodiment of the present disclosure.

FIG. 5 is a block diagram illustrating a differential amplification-based OOK modulator according to an embodiment of the present disclosure.

Referring to FIG. 5, an OOK modulator 500, which receives a carrier wave having a frequency of several GHz through a carrier wave input part 505, may modulate the carrier wave based on input data in a differential amplification-based OOK modulation manner, and output the modulated signal through a modulated signal output part 580.

Specifically, when the carrier wave of several GHz is input to the carrier wave input part 505, the carrier wave may be impedance-matched through the input matching part 510 and then inputted to a single-to-differential (S2D) conversion part 530. In general, impedance matching should be considered for circuits operating at high speeds above a few tens of MHz. If the impedance is not matched when the frequency is high, the power of the input signal may be reflected to the outside of the carrier wave input part 505. Therefore, when the impedance matching is performed, power loss may be minimized, so that transmission power can be maximized, high power gain and voltage gain can be obtained, and input signal distortion can be prevented. Thus, the carrier wave input through the input matching part 510 may be input to the S2D conversion part 530 while minimizing signal distortion and power loss. In this case, the S2D conversion part 530 may include a first amplifier that operates based on the impedance-matched input data, which will be described later in the embodiment of FIG. 6.

Then, the input data input through the data input part 525 may be input to the S2D conversion part 530 through the first switch part 520. The first switch part 520 may be turned on when the input data represented by a high-low signal is at a HIGH level and may be turned off when the input data is at a LOW level. The state (i.e., the same value as the input data or another value or state associated with the value of the input data) of the input data input to an input end of the S2D conversion part 530 may be converted to differential signals based on operations of the first amplifier included in the S2D conversion part 530, and then transmitted to the differential amplification part 540 to be subjected to differential amplification. Here, the differential signals may include one signal (first differential signal) and another signal (second differential signal) having a certain difference from the first differential signal.

Figure 6:
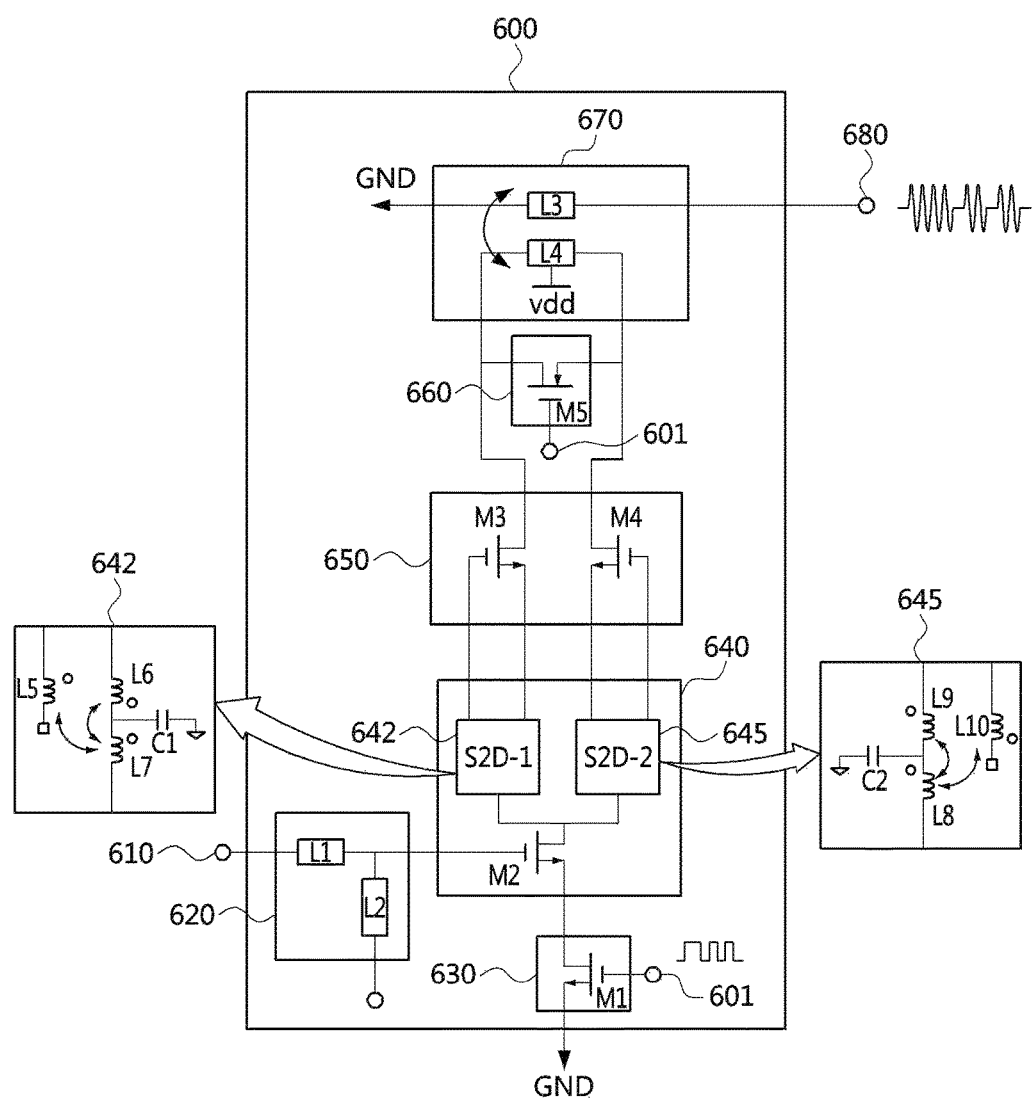
FIG. 6 is a circuit diagram illustrating a differential amplification-based OOK modulator according to an embodiment of the present disclosure.

The S2D conversion part 530 may include an amplifier (e.g., the first amplifier which may be implemented as an N-type MOSFET) and two transformers connected in parallel thereto, as shown in FIG. 6. In this manner, a single signal input to the S2D conversion part 530 may be converted into two differential signals and output. The detailed internal structure and operation of the S2D conversion part 530 will be described in an embodiment of FIG. 6 according to the present disclosure.

The differential amplified two differential signals (the first differential signal and the second differential signal) may be transmitted to the D2S conversion part 560 by the second switch part 550. The second switch part 550 may operate in reverse to the operation of the first switch part 520. That is, when the first switch part 520 is turned on, the second switch part 550 is turned off, and when the first switch part 520 is turned off, the second switch part 550 is turned on. For this, the first switch part 520 and the second switch part 550 may be implemented to operate oppositely to each other. In this case, the same input data as the input data input to the first switch part 520 may be received simultaneously through the data input part 525, and the on-off operations may be performed on the switch parts at the same on-off speed and rate. Alternatively, the first switch part 520 and the second switch part 550 may be implemented in the same structure, but polarities of the input data input to both switch parts may be opposite to each other.

When both output ends of the differential amplification part 540 are connected using the second switch part 550

(e.g., a HIGH value is input to a gate of M5 shown in FIG. 6), a differential signal corresponding to zero in the OOK modulation may be output to the D2S conversion part 560. On the other hand, when the second switch is opened (i.e., turned off), a differential signal corresponding to non-zero in the OOK modulation may be output to the D2S conversion part 560. This is because the OOK modulator 500 operates only in terms of an RF signal irrespective of the flow of the internal current, and high-speed operation is possible with this feature. That is, the second switch part 550 controls only flow of the RF differential signal through the differential amplification part 540. Since DC signal components of the output signals of the differential amplification part 540 connected to the second switch part 550 have the same value, they are not affected by the operation of the second switch part, the second switch part 550 is not involved in charging and discharging operation according to the DC signal components. Also, since the second switch part 550 is not involved in setting of a DC bias current of the OOK modulator, the size of the second switch part 550 may be freely set, and the second switch part 550 may be a small-sized switch operating at a high speed with less parasitic component. There is a problem in that it takes time to drive an operating current of the OOK modulator 500 when using only the first switch part 520. In order to drive enough current for the OOK modulation, a large size switch should be used, which makes it difficult to perform the OOK modulation at high speed.

The differential signal input to the D2S conversion part 560 may be converted into a single signal. The converted single signal may be generated as a modulated signal via the output matching part 570 and then output through the modulated signal output part 580. The OOK modulation using the first switch part 520 and the second switch part 550 not only reduces power consumption but also achieves high gain without current increase according to current reuse in the S2D conversion part 540 to be described later in an embodiment of FIG. 6. In general, when a high-frequency signal such as a millimeter-wave band signal is amplified, an oscillation phenomenon may occur in a circuit, thereby reducing the stability of the circuit. However, as in the embodiment of the present disclosure, by using the S2D conversion part 530 having a single amplifier and two transformers having a structure for inducing magnetic fluxes opposite to each other, it is made possible to implement the OOK modulator having high frequency characteristic stability and high power gain. Hereinafter, an implementation of a differential amplification-based OOK modulator by using electric components according to an embodiment of the present disclosure will be described.

FIG. 6 is a circuit diagram illustrating a differential amplification-based OOK modulator according to an embodiment of the present disclosure.

Referring to FIG. 6, a differential amplification-based OOK modulator 600 may comprise an input matching part 620 including a plurality of inductors, a D2S conversion and output matching part 670 (which performs both of the D2S conversion and the output matching function), a first switch part 630, a second switch part 660, and a differential amplification part 650 which are based on at least one metal-oxide semiconductor field effect transistor (MOSFET), and a S2D conversion part 620 including a plurality of transformers and a MOSFET-based amplifier M2.

Specifically, the input matching part 620 may be implemented using various RLC circuits for impedance matching. In an embodiment of FIG. 6, the input matching part 620 may be implemented by two inductors L1 and L2 connected in parallel. However, the input matching part is not limited thereto and may be implemented by various types of impedance matching circuits.

The first switch part 630 and the second switch part 660 may be implemented with MOSFET. The first switch part 630 may include a M1 implemented as an N-type MOSFET (hereinafter referred to as 'N-MOS'), and the second switch part 660 may include a M5 implemented as a P-type MOSFET (hereinafter referred to as 'P-MOS'). In case that the input data is input to a gate of M1 of the first switch part 630 and a gate of M5 of the second switch part 660 via a data input part 601, if each bit of the input data is a HIGH value, M1 may be turned on, and a channel is formed between a source and a drain of M1 so that they are electrically connected. Also, M5 may be turned off, and a channel is not formed between a source and a drain of M5 so that they are electrically disconnected. On the other hand, if each bit of the input data is a LOW value, M1 may be turned off, and a channel between the source and the drain of M1 is not formed so that they are electrically disconnected. Also, M5 may be turned on, and a channel is formed between the source and the drain of M5 so that they are electrically connected. Alternatively, the first switch part 630 and the second switch part 660 may be implemented using MOSFETs of the same type. In this case, input data to be input to the gates of M1 and M5 should have different polarities. That is, if the value of the input data input to M1 is a HIGH value, the value of the input data input to M5 should be a LOW value. If the value of input data input to M1 is a LOW value, the value of the input data input to M5 should be a HIGH value.

A carrier wave of GHz band input to a carrier wave input part 610 and passed through the input matching part 620 may be transmitted to a gate of M2 in the S2D conversion part 640. A voltage applied to the gate of M2 in the S2D conversion part 640 may be changed according to a periodically varying HIGH or LOW value of the carrier wave so that a drain and a source of M2 is electrically connected and disconnected periodically. When a HIGH value is applied to the gate of M2, a value related to the state of the input data applied to M1 of the first switch part may be transmitted to a S2D-1 642 and a S2D-2 645 through the drain of M2. Thus, only when the input data from the data input part 601 has a HIGH value, the input data may be carried on the carrier wave, reducing the average power consumption by 50% over other modulation schemes. The types of MOSFETs used for M1 to M5 may be changed to different types of MOSFETs depending on implementations (e.g., a case of operating a power supply polarity of the system in reverse).

An output signal of the drain of M2 may be input to transformers of the S2D-1 642 and the S2D-2 645. The output signal of the drain of M2 may reach an inductor L7 of the S2D-1 642 and an inductor L8 of the S2D-2 645. An induction voltage may be generated in the inductor L5 coupled in the same direction with the inductor L7 of the S2D-1 642, and an induction voltage that is 180 degrees out of phase with the voltage generated in the inductor L5 may be generated in an inductor L6 coupled in the opposite direction with the inductor L7. Also, an induction voltage may be generated in the inductor L10 coupled in the opposite direction with the inductor L8 of the S2D-2 645, and an induction voltage that is 180 degrees out of phase with the voltage generated between the inductor L8 and the inductor L10 may be generated in an inductor L9 coupled in the same direction with the inductor L8. When the output signal of the drain of M2 is transmitted to the S2D-1 642 and the S2D-2 645, two differential signals (the first differential signal and the second differential signal) may be output from output ends of the S2D-1 642 and the S2D-2 645. Here, a conventionally-used dot convention is used to indicate a magnetic coupling relationship between a primary side and a secondary side of each of the transformers S2D-1 642 and S2D-2 645. If magnetic fluxes caused by currents flowing through inductors in primary and secondary sides are in the same direction, dots are marked in the same sides of the inductors, and if magnetic fluxes caused by currents flowing through inductors in primary and secondary sides are in the opposite directions, dots are marked in the opposite sides of the inductors.

The inductor L5 may be connected to a gate of M3 of the differential amplification part 650, and the inductor L6 may be connected to a source of M3 of the differential amplification part 650. Also, the inductor L10 may be connected to a gate of M4 of the differential amplification part 650, and the inductor L9 may be connected to a source of M4 of the differential amplification part 650. The signals input to the gates of M3 and M4 may have a phase difference of 180 degrees from each other, and the output signal of the drain of M2 may be differentially amplified by M3 and M4. That is, the inductors of the S2D conversion part 640 connected to the gates and sources of M3 and M4 of the differential amplification part 650 may supply signals having a phase difference of 180 degrees to the gates and sources, which can lead to an increase in the voltage swing magnitude between the gates and sources of M3 and M4. This structure may enable a high-frequency OOK modulation that increases output swing and gain. Also, the inductors L6 and L9 connected to the sources of M3 and M4 may perform a source-degeneration function to alleviate the problem of oscillation in the high-frequency amplifier. Also, isolation between on-offs may be increased. The transformers in the S2D conversion part may be implemented variously as shown in FIGS. 9A to 9D to be described later. That is, the transformers in the S2D conversion part may be implemented in four types as shown in FIGS. 9A to 9D. The embodiment of FIG. 6 may correspond to a case 2 in FIG. 9B, and three other cases (cases 1, 3, and 4) may be used to implement the transformers depending on various implementations of the wireless communication system.

Meanwhile, a capacitor C1 connected between the inductor L6 and the inductor L7, and a capacitor C2 connected between the inductor L8 and the inductor L9 may allow each of M3 and M4 of the differential amplification part 650 to operate in a common source structure. This may allow M3 and M4 to perform more efficient amplification operation than a common gate or a common drain structure, and have an effect of reusing currents supplied through the source and drain of M2 in M3 and M4 of the differential amplification part 650. That is, from a direct current (DC) perspective, the currents may not be lost to the ground due to the capacitors C1 and C2, but be flowed back to the drain of M2 of the S2D conversion part and reused for the operation of M2. Also, from an alternating current (AC) perspective, the capacitors C1 and C2 may operate as the ground, and the input data may be input to the gate and source of each of M3 and M4 of the differential amplification part 650 through the S2D conversion part 640 by the common source amplification operation of M2, so that the differential amplification part 650 operates as a common source differential amplifier.

The differential signals amplified by M3 and M4 of the differential amplification part 650 may be controlled by the second switch part 660 and input to the D2S conversion and output matching part 670. The D2S conversion and output matching part 670 may convert the differential signals into a single signal and at the same time perform impedance matching with the modulated signal output part 680 to transmit maximum power to the modulated signal output part 680. The D2S conversion and output matching part 670 may be configured to include two coupled inductors (inductor L3 and inductor L4). The differential signals from the differential amplification part 650, which are applied to both ends of the inductor L4, may be transferred to the inductor L3 with one of two voltage states (first voltage value, second voltage value) according to on or off of the second switch part 660. The OOK modulated signal may be transferred to the modulated signal output part 680 while simultaneously performing the D2S conversion and the output matching function. Hereinafter, integrated circuit implementation of the transformers implemented in the S2D-1 642 and the S2D-2 645 for generating the differential signals of the S2D conversion part will be described.

Figure 7A:
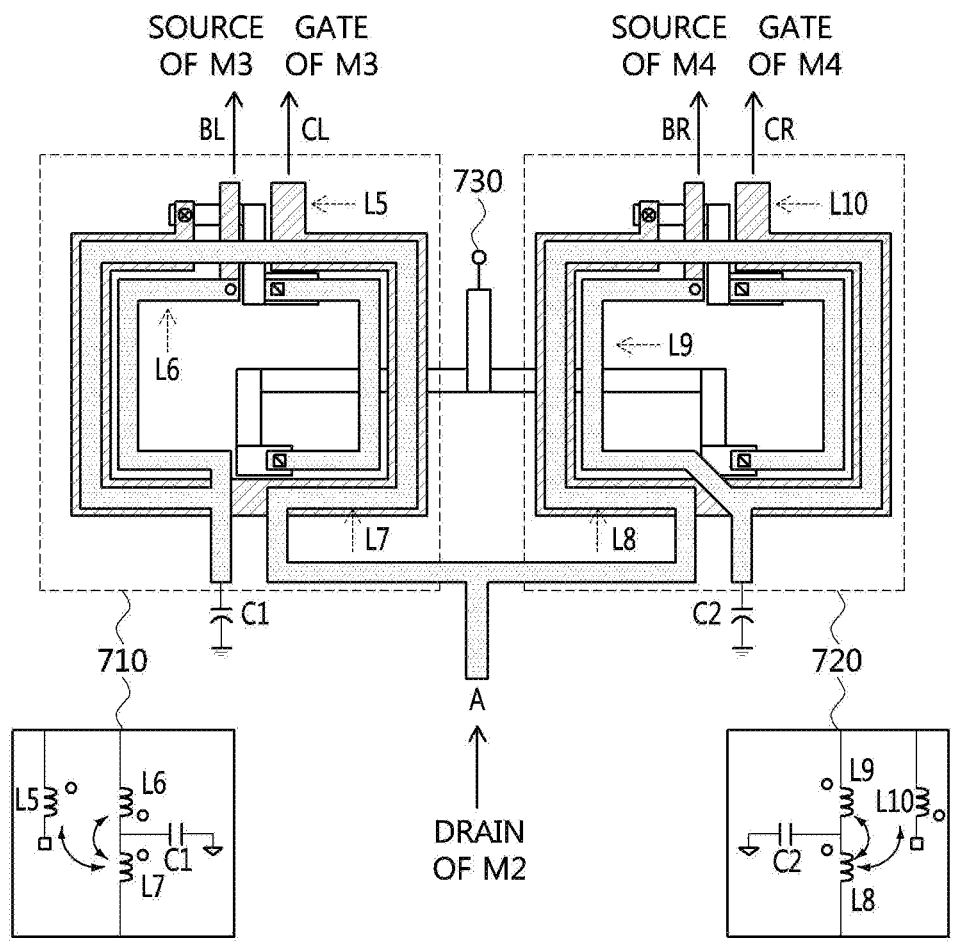
FIGS. 7A and 7B are conceptual diagrams illustrating an integrated circuit implementation of a S2D conversion part according to an embodiment of the present disclosure
Figure 7B:
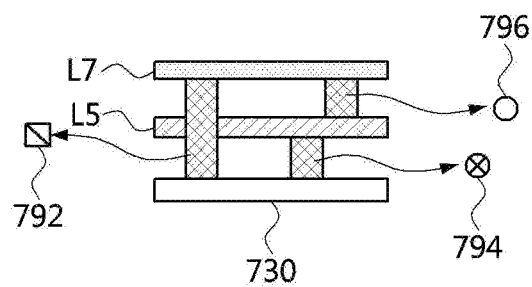

FIGS. 7A and 7B are conceptual diagrams illustrating an integrated circuit implementation of a S2D conversion part according to an embodiment of the present disclosure.

FIG. 7A illustrates a top side view of an integrated circuit for two transformers in the S2D conversion part, and FIG. 7B illustrates a side cross-sectional view of a vertical section of the S2D-1 in the S2D conversion part. Referring to FIG. 7A, The drain of M2 of the S2D conversion part 640 of FIG. 6 may be connected to a terminal A of FIG. 7A. A metal line starting at the terminal A may be branched to both left and right. First, a part branched to the left may constitute a metal line constituting the S2D-1 710, and a part branched to the right may constitute a metal line constituting the S2D-2 720. In the S2D-1 710, an outermost metal line is rotated counterclockwise along a line L7 to implement a rectangular inductor L7. Also, an inner metal line, which is continued from the outermost metal line, is rotated in the opposite direction to L7 along a line L6 to implement a rectangular inductor L6, and connected to a source of M3 through a node BL and a via 796.

Referring to FIG. 7B, The inductor L5 coupled in the same direction with the inductor L7 may be implemented to be connected to a node CL and not directly coupled to the inductor L7. A bias node 730 and the inductor L6 may be connected to the via 796 and the inductor L5 and the bias node 730 may be connected to a via 794. Thus, induction voltages having a phase difference of 180 degrees between the two transformers of the S2D-1 710 may be generated.

Similarly, in the S2D-2 720, an outermost metal line is rotated clockwise along a line L8 to implement a rectangular inductor L8. Also, an inner metal line, which is continued from the outermost metal line, is rotated in the same direction as L8 along a line L9 to implement a rectangular inductor L9, and connected to a source of M4 through a node BR and a via 796. Also, the inductor L10 coupled in the opposite direction with the inductor L9 may be implemented to be connected to a node CR and not directly coupled to the inductor L8. Thus, induction voltages having a phase difference of 180 degrees between the two transformers of the S2D-2 720 may be generated.

The S2D-1 710 and the S2D-2 720 may be implemented to form different magnetic fluxes through the integrated circuit implementation as in the above-described embodiment. Also, according to the overlapping structure of transformers in the S2D-1 710 and S2D-2 720, increase in the size of the integrated circuit may be minimized.

Figure 8A:
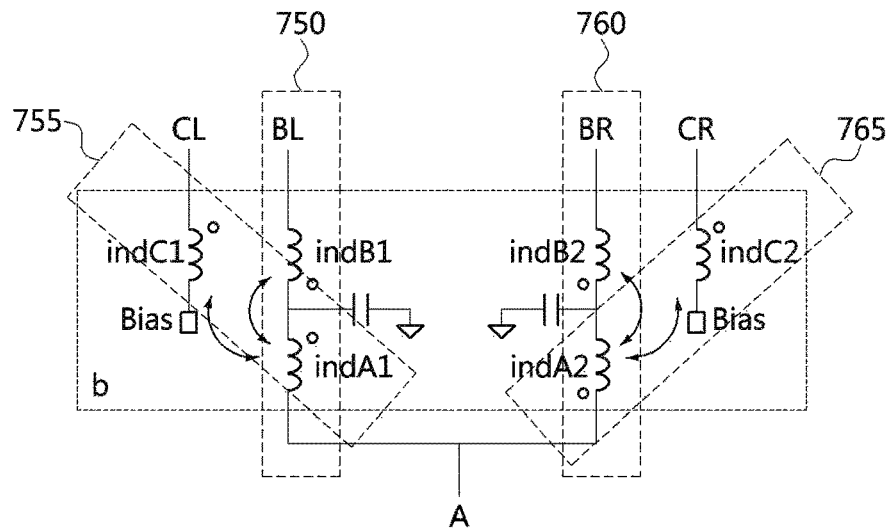
FIG. 8A is a circuit diagram for explaining an implementation of a S2D conversion part in terms of current flow.
Figure 8B:
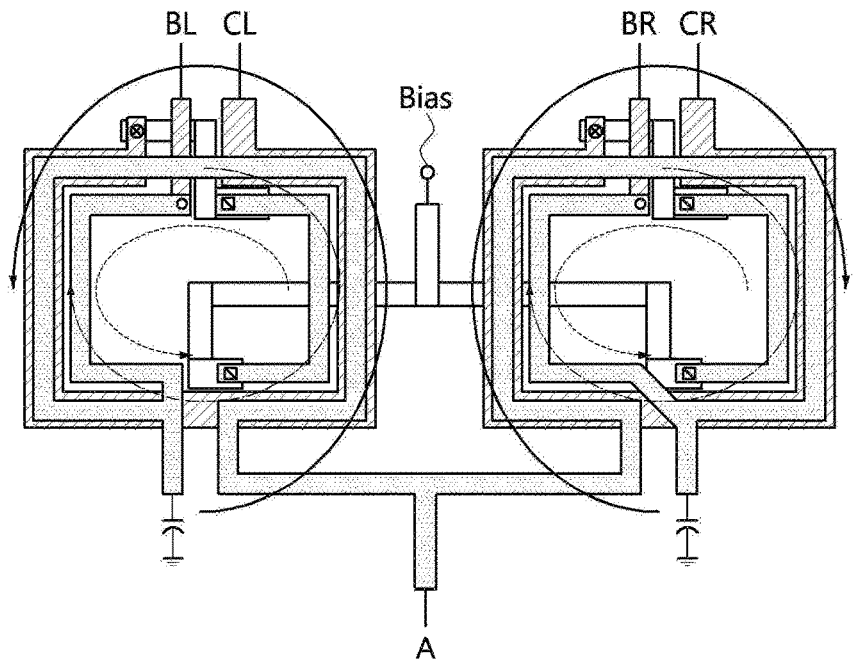
FIG. 8B is a conceptual diagram illustrating an integrated circuit implementation corresponding to the circuit diagram of FIG. 8A.
Figure 9A:
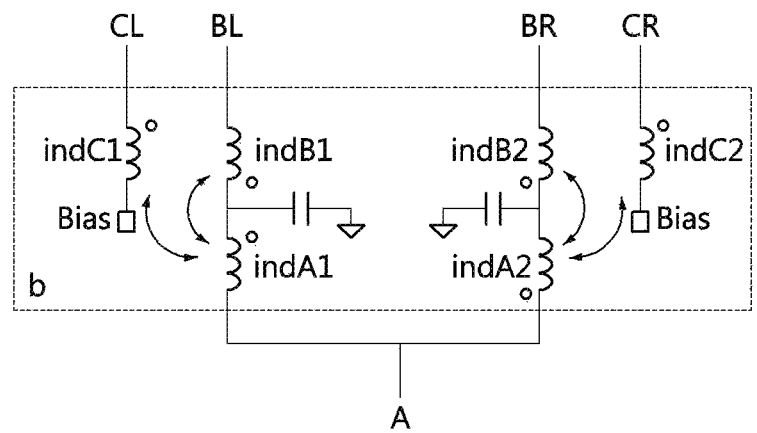
FIGS. 9A to 9D are circuit diagrams illustrating various implementations of an S2D conversion part according to embodiments of the present disclosure.
Figure 9B:
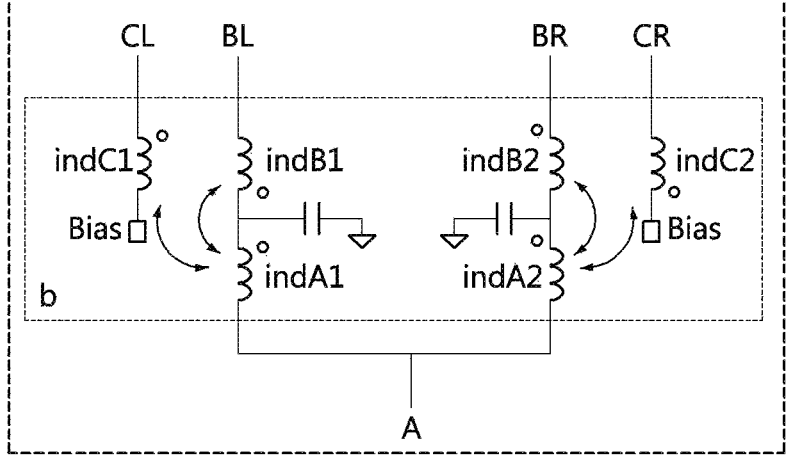
Figure 9C:
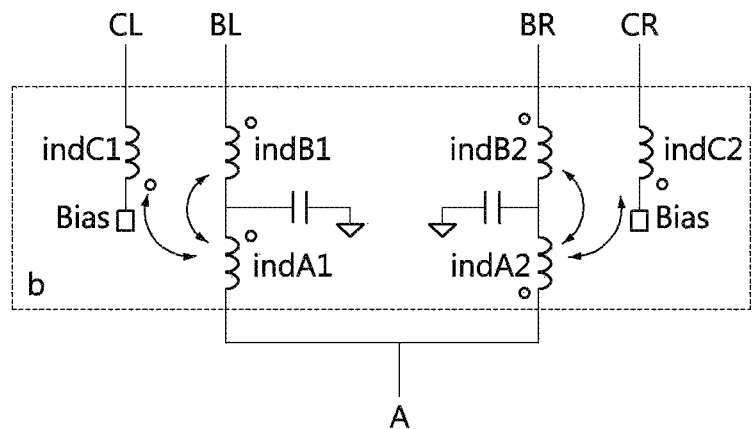
Figure 9D:
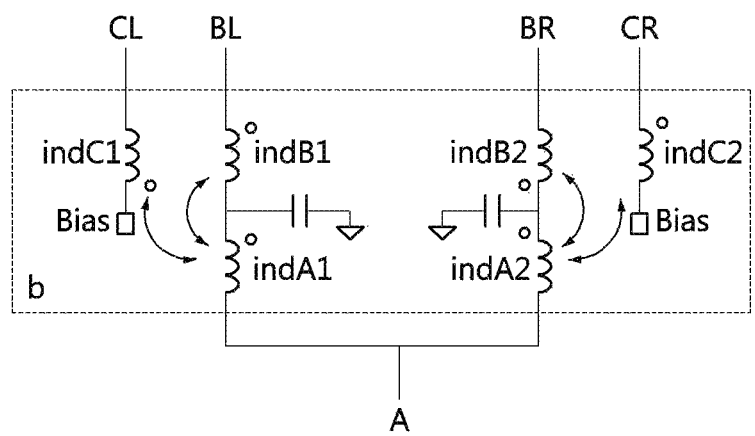

FIG. 8A is a circuit diagram for explaining an implementation of a S2D conversion part in terms of current flow, and FIG. 8B is a conceptual diagram illustrating an integrated circuit implementation corresponding to the circuit diagram of FIG. 8A.

The S2D conversion part may include four transformers as described above. Specifically, as shown in FIG. 7B, a first transformer 750 (i.e., a transformer comprising indA1 and indB1), a second transformer 755 (i.e., a transformer comprising indA1 and indC1), a third transformer 760 (i.e., a transformed comprising indA2 and indB2), and a fourth transformer 765 (i.e., a transformer consisting of indA2 and indC2). The indA1 may operate as a primary inductor for each of indB1 and indC1 to constitute the transformer 750 and the transformer 755. Also, the indA2 may operate as a primary inductor for each of indB2 and indC2 to constitute the transformer 760 and the transformer 765. As described above, a conventionally-used dot convention is used to indicate a magnetic coupling relationship between a primary side and a secondary side of each of the transformers. If magnetic fluxes caused by currents flowing through inductors in primary and secondary sides are in the same direction, dots are marked in the same sides of the inductors, and if magnetic fluxes caused by currents flowing through inductors in primary and secondary sides are in the opposite directions, dots are marked in the opposite sides of the inductors.

Specifically, when constructing the S2D conversion part, indB1 may be configured to form magnetic fluxes opposite to those of indC1, and indB2 may be configured to form magnetic fluxes opposite to those of indC2. Thus, signal phases of the node CL and the node BL may be made opposite to each other, and signal phases of the node CR and the node BR may be made opposite to each other. Also, magnetic fluxes of indA1 and indA2 may be formed in opposite directions, or magnetic fluxes of indB1 and indB2 may be formed in the opposite directions. Thus, the magnetic fluxes of indC1 and indC2 may have opposite directions, signal phases of the nodes BL and BR may be opposite to each other, and signal phases of the nodes CL and CR may be opposite to each other. Meanwhile, the S2D conversion part may be implemented in a manner different from that shown in FIGS. 7A and 7B. Hereinafter, other implementations of the transformers of the S2D conversion part will be described.

FIGS. 9A to 9D are circuit diagrams illustrating various implementations of an S2D conversion part according to embodiments of the present disclosure.

Referring to FIGS. 9A to 9D, the transformers included in the S2D conversion part may be arranged in four types. The embodiment of FIGS. 7A and 7B may correspond to a case 2 in FIG. 9B. Three different cases (case 1, case 3, and case 4) may be implemented depending on the implementation of the wireless communication system. Table 1 below shows the coupling direction between inductors for each case.

TABLE 1

|  | indA1 & indA2 | indA1 & indB1 | indA1 & indC1 | indA2 & indB2 | indA2 & indC2 |
|---|---|---|---|---|---|
| case1 | opposite | opposite | same | same | opposite |
| case2 | same | same | same | same | opposite |
| case3 | opposite | same | opposite | opposite | same |
| case4 | same | same | opposite | opposite | same |

As shown in Table 1, when implementing the S2D conversion part, the magnetic fluxes of indA1 and indA2 may be formed in opposite directions or in the same direction. That is, indA1 may be implemented to flow a current in a counterclockwise direction, and indA2 may be implemented to flow a current in a clockwise or counterclockwise direction.

Also, indB1 may be configured to form magnetic fluxes opposite to those of indC1 (with respect to indA1), and indB2 may be configured to form magnetic fluxes opposite to those of indC2 (with respect to indA2).

In the differential amplification-based OOK modulation apparatus according to the embodiments of the present disclosure, in order to reduce additional power consumption caused by the ON operations in the OOK modulation, the structure for reusing currents in the S2D conversion part is adopted so that low power modulation can be realized. That is, a differential amplification circuit for high-speed switching operations can be implemented, and at the same time, currents can be collected and reused for differential amplification.

Also, in general, switching operation speed may be reduced due to use of a large amount of current when it is required to achieve a high gain at the same time as the OOK modulation of high-frequency signals. However, by using the differential amplification based OOK modulation method according to the embodiments of the present disclosure, it is made possible to improve performance of the switching operation that determines a data transmission rate while reducing power consumption. Further, it is made possible to eliminate instability due to high-frequency oscillation, which is likely to occur when high-frequency signals such as millimeter-wave band signals are amplified, thereby achieving high stability and high signal amplification gain.

The embodiments of the present disclosure may be implemented as program instructions executable by a variety of computers and recorded on a computer readable medium. The computer readable medium may include a program instruction, a data file, a data structure, or a combination thereof. The program instructions recorded on the computer readable medium may be designed and configured specifically for the present disclosure or can be publicly known and available to those who are skilled in the field of computer software.

Examples of the computer readable medium may include a hardware device such as ROM, RAM, and flash memory, which are specifically configured to store and execute the program instructions. Examples of the program instructions include machine codes made by, for example, a compiler, as well as high-level language codes executable by a computer, using an interpreter. The above exemplary hardware device can be configured to operate as at least one software module in order to perform the embodiments of the present disclosure, and vice versa.

While the embodiments of the present disclosure and their advantages have been described in detail, it should be understood that various changes, substitutions and alterations may be made herein without departing from the scope of the present disclosure.

What is claimed is:

1. A data modulation apparatus comprising:
a single-to-differential (S2D) conversion part including a first amplifier operating based on a carrier wave signal and two transformers receiving an output signal of the first amplifier;
a first switch part transferring status of input data to the first amplifier based on the input data;
a differential amplification part receiving output signals of the S2D conversion part and amplifying the output signals of the S2D conversion part;

a differential-to-signal (D2S) conversion part receiving output signals of the differential amplification part and performing modulation on the output signals of the differential amplification part by converting the output signals of the differential amplification part to a single signal; and a second switch part transferring the output signals of the differential amplification part to the D2S conversion part based on the input data, wherein the first switch part and the second switch part are alternately turned on and off, and the two transformers include a first transformer connected to a first inductor of the first amplifier and a second transformer connected to a second inductor of the first amplifier, wherein the first inductor and the second inductor are connected in parallel with the first amplifier.

2. The data modulation apparatus according to claim 1, further comprising an input matching part receiving the carrier wave signal and outputting the carrier wave signal to the first amplifier.

3. The data modulation apparatus according to claim 1, wherein the differential amplification part includes a second amplifier and a third amplifier each of which receives differential output signals from the S2D conversion part.

4. The data modulation apparatus according to claim 1, wherein the first transformer includes a first inductor connected in series to the first inductor of the first amplifier and a second inductor connected to the first inductor of the first amplifier in a non-contact manner, and the second transformer includes a first inductor connected in series to the second inductor of the first amplifier and a second inductor connected to the second inductor of the first amplifier in a non-contact manner.

5. The data modulation apparatus according to claim 4, wherein a phase difference between a mutual inductive voltage between the first inductor of the first amplifier and the first inductor of the first transformer and a mutual inductance voltage between the first inductor of the first amplifier and the second inductor of the first transformer is 180 degrees, and a phase difference between a mutual inductive voltage between the second inductor of the first amplifier and the first inductor of the second transformer and a mutual inductance voltage between the second inductor of the first amplifier and the second inductor of the second transformer is 180 degrees.

6. The data modulation apparatus according to claim 4, further comprising a first capacitor connected in parallel between the first inductor of the first amplifier and the first inductor of the first transformer, and a second capacitor connected in parallel between the second inductor of the first amplifier and the first inductor of the second transformer.

7. The data modulation apparatus according to claim 3, wherein input ends of the second amplifier are connected to output ends of the first transformer, and input ends of the third amplifier are connected to output ends of the second transformer.

8. The data modulation apparatus according to claim 1, wherein the D2S conversion part performs D2S conversion and output matching through coupling between an inductor connected to the output ends of the differential amplification part and an inductor connected to a modulated signal output part.

9. A data modulation method in a wireless communication system, comprising: receiving a carrier wave signal by a first amplifier of a single-to-differential (S2D) conversion part; receiving input data by input ends of a first switch part and a second switch part; converting an output signal of the first amplifier into differential signals by using two transformers connected in parallel with output ends of the first amplifier; differentially amplifying the differential signals by a differential amplification part including a second amplifier and a third amplifier; and transferring output signals of the differential amplification part to a differential-to-single (D2S) conversion part based on an operation of the second switch part, wherein the D2S conversion part performs D2S conversion and output matching through coupling between an inductor connected to output ends of the differential amplification part and an inductor connected to a modulated signal output part.

10. The data modulation method according to claim 9, wherein the first switch part and the second switch part are alternately turned on and off.

11. The data modulation method according to claim 9, wherein the carrier wave signal input to the first amplifier of the S2D conversion part is input-matched.

12. The data modulation method according to claim 9, wherein the two transformers include a first transformer connected to a first inductor of the first amplifier and a second transformer connected to a second inductor of the first amplifier, and the first inductor and the second inductor are connected in parallel with the first amplifier.

13. The data modulation method according to claim 12, wherein the first transformer includes a first inductor connected in series to the first inductor of the first amplifier and a second inductor connected to the first inductor of the first amplifier in a non-contact manner, and the second transformer includes a first inductor connected in series to the second inductor of the first amplifier and a second inductor connected to the second inductor of the first amplifier in a non-contact manner.

14. The data modulation method according to claim 13, wherein a phase difference between a mutual inductive voltage between the first inductor of the first amplifier and the first inductor of the first transformer and a mutual inductance voltage between the first inductor of the first amplifier and the second inductor of the first transformer is 180 degrees, and a phase difference between a mutual inductive voltage between the second inductor of the first amplifier and the first inductor of the second transformer and a mutual inductance voltage between the second inductor of the first amplifier and the second inductor of the second transformer is 180 degrees.

15. The data modulation method according to claim 13, wherein the S2D conversion part further comprises a first capacitor connected in parallel between the first inductor of the first amplifier and the first inductor of the first transformer, and a second capacitor connected in parallel between the second inductor of the first amplifier and the first inductor of the second transformer.

16. The data modulation method according to claim 12, wherein input ends of the second amplifier are connected to output ends of the first transformer, and input ends of the third amplifier are connected to output ends of the second transformer.

* * * * *